US008648426B2

(12) United States Patent
Jin et al.

(10) Patent No.: US 8,648,426 B2
(45) Date of Patent: Feb. 11, 2014

(54) TUNNELING TRANSISTORS

(75) Inventors: Insik Jin, San Jose, CA (US); Wei Tian, Bloomington, MN (US); Venugopalan Vaithyanathan, Bloomington, MN (US); Cedric Bedoya, Edina, MN (US); Markus Siegert, Minneapolis, MN (US)

(73) Assignee: Seagate Technology LLC, Cupertino, CA (US)

( * ) Notice: Subject to any disclaimer, the term of this patent is extended or adjusted under 35 U.S.C. 154(b) by 243 days.

(21) Appl. No.: 12/971,393

(22) Filed: Dec. 17, 2010

(65) Prior Publication Data

US 2012/0153400 A1 Jun. 21, 2012

(51) Int. Cl.
*H01L 21/70* (2006.01)

(52) U.S. Cl.
USPC .................. 257/390; 257/411; 257/E27.099; 257/E29.255

(58) Field of Classification Search
USPC .................. 257/390, 411, E27.099, E29.255
See application file for complete search history.

(56) References Cited

U.S. PATENT DOCUMENTS

| | | | |
|---|---|---|---|
| 3,982,233 A | 9/1976 | Crookshanks |
| 3,982,235 A | 9/1976 | Bennett |
| 3,982,266 A | 9/1976 | Matzen |
| 4,056,642 A | 11/1977 | Saxena |
| 4,110,488 A | 8/1978 | Risko |
| 4,160,988 A | 7/1979 | Russell |
| 4,232,057 A | 11/1980 | Ray |
| 4,247,915 A | 1/1981 | Bartlett |
| 4,323,589 A | 4/1982 | Ray |
| 4,576,829 A | 3/1986 | Kaganowicz |
| 4,901,132 A | 2/1990 | Kawano |
| 5,135,878 A | 8/1992 | Bartur |
| 5,278,636 A | 1/1994 | Williams |
| 5,330,935 A | 7/1994 | Dobuzinsky |
| 5,412,246 A | 5/1995 | Dobuzinsky |
| 5,443,863 A | 8/1995 | Neely |
| 5,580,804 A | 12/1996 | Joh |
| 5,614,430 A | 3/1997 | Liang |
| 5,739,564 A | 4/1998 | Kosa |
| 5,872,052 A | 2/1999 | Iyer |
| 5,913,149 A | 6/1999 | Thakur |
| 5,923,948 A | 7/1999 | Cathey, Jr. |

(Continued)

FOREIGN PATENT DOCUMENTS

DE 102008026432 12/2009
EP 1329895 7/2003

(Continued)

OTHER PUBLICATIONS

Adee, S., "Quantum Tunneling Creates Fast Lane for Wireless", IEEE Spectrum, Oct. 2007.

(Continued)

*Primary Examiner* — Timor Karimy
(74) *Attorney, Agent, or Firm* — Mueting Raasch & Gebhardt

(57) ABSTRACT

A transistor including a source; a drain; a gate region, the gate region including a gate; an island; and a gate oxide, wherein the gate oxide is positioned between the gate and the island; and the gate and island are coactively coupled to each other; and a source barrier and a drain barrier, wherein the source barrier separates the source from the gate region and the drain barrier separates the drain from the gate region.

17 Claims, 3 Drawing Sheets

(56) References Cited

U.S. PATENT DOCUMENTS

| | | |
|---|---|---|
| 5,929,477 A | 7/1999 | McAllister |
| 6,011,281 A | 1/2000 | Nunokawa |
| 6,013,548 A | 1/2000 | Burns |
| 6,034,389 A | 3/2000 | Burns |
| 6,077,745 A | 6/2000 | Burns |
| 6,100,166 A | 8/2000 | Sakaguchi |
| 6,114,211 A | 9/2000 | Fulford |
| 6,121,642 A | 9/2000 | Newns |
| 6,121,654 A | 9/2000 | Likharev |
| 6,165,834 A | 12/2000 | Agarwal |
| 6,300,205 B1 | 10/2001 | Fulford |
| 6,341,085 B1 | 1/2002 | Yamagami |
| 6,346,477 B1 | 2/2002 | Koloyeros |
| 6,376,332 B1 | 4/2002 | Yankagita |
| 6,448,840 B2 | 9/2002 | Kao |
| 6,462,931 B1 * | 10/2002 | Tang et al. .................... 361/305 |
| 6,534,382 B1 | 3/2003 | Sakaguchi |
| 6,617,642 B1 | 9/2003 | Georgesca |
| 6,624,463 B2 | 9/2003 | Kim |
| 6,653,704 B1 | 11/2003 | Gurney |
| 6,667,900 B2 | 12/2003 | Lowrey |
| 6,724,025 B1 | 4/2004 | Takashima |
| 6,750,540 B2 | 6/2004 | Kim |
| 6,753,561 B1 | 6/2004 | Rinerson |
| 6,757,842 B2 | 6/2004 | Harari |
| 6,781,176 B2 | 8/2004 | Ramesh |
| 6,789,689 B1 | 9/2004 | Beale |
| 6,800,897 B2 | 10/2004 | Baliga |
| 6,842,368 B2 | 1/2005 | Hayakawa |
| 6,853,031 B2 | 2/2005 | Liao |
| 6,917,539 B2 | 7/2005 | Rinerson |
| 6,940,742 B2 | 9/2005 | Yamamura |
| 6,944,052 B2 | 9/2005 | Subramanian |
| 6,979,863 B2 | 12/2005 | Ryu |
| 7,009,877 B1 | 3/2006 | Huai |
| 7,045,840 B2 | 5/2006 | Tamai |
| 7,051,941 B2 | 5/2006 | Yui |
| 7,052,941 B2 | 5/2006 | Lee |
| 7,098,494 B2 | 8/2006 | Pakala |
| 7,130,209 B2 | 10/2006 | Reggiori |
| 7,161,861 B2 | 1/2007 | Gogl |
| 7,180,140 B1 | 2/2007 | Brisbin |
| 7,187,577 B1 | 3/2007 | Wang |
| 7,190,616 B2 | 3/2007 | Forbes |
| 7,200,036 B2 | 4/2007 | Bessho |
| 7,215,568 B2 | 5/2007 | Liaw |
| 7,218,550 B2 | 5/2007 | Schwabe |
| 7,224,601 B2 | 5/2007 | Panchula |
| 7,233,537 B2 | 6/2007 | Tanizaki |
| 7,236,394 B2 | 6/2007 | Chen |
| 7,247,570 B2 | 7/2007 | Thomas |
| 7,272,034 B1 | 9/2007 | Chen |
| 7,272,035 B1 | 9/2007 | Chen |
| 7,273,638 B2 | 9/2007 | Belyansky |
| 7,274,067 B2 | 9/2007 | Forbes |
| 7,282,755 B2 | 10/2007 | Pakala |
| 7,285,812 B2 | 10/2007 | Tang |
| 7,286,395 B2 | 10/2007 | Chen |
| 7,289,356 B2 | 10/2007 | Diao |
| 7,345,912 B2 | 3/2008 | Luo |
| 7,362,618 B2 | 4/2008 | Harari |
| 7,378,702 B2 | 5/2008 | Lee |
| 7,379,327 B2 | 5/2008 | Chen |
| 7,381,595 B2 | 6/2008 | Joshi |
| 7,382,024 B2 | 6/2008 | Ito |
| 7,391,068 B2 | 6/2008 | Kito |
| 7,397,713 B2 | 7/2008 | Harari |
| 7,413,480 B2 | 8/2008 | Thomas |
| 7,414,908 B2 | 8/2008 | Miyatake |
| 7,416,929 B2 | 8/2008 | Mazzola |
| 7,432,574 B2 | 10/2008 | Nakamura |
| 7,440,317 B2 | 10/2008 | Bhattacharyya |
| 7,456,069 B2 | 11/2008 | Johansson |
| 7,465,983 B2 | 12/2008 | Eldridge |
| 7,470,142 B2 | 12/2008 | Lee |
| 7,470,598 B2 | 12/2008 | Lee |
| 7,502,249 B1 | 3/2009 | Ding |
| 7,515,457 B2 | 4/2009 | Chen |
| 7,542,356 B2 | 6/2009 | Lee |
| 7,646,629 B2 | 1/2010 | Hamberg |
| 7,692,610 B2 * | 4/2010 | Kimura ........................ 345/76 |
| 7,697,322 B2 | 4/2010 | Leuschner |
| 7,738,279 B2 | 6/2010 | Siesazeck |
| 7,738,881 B2 | 6/2010 | Krumm |
| 7,829,875 B2 | 11/2010 | Scheuerlein |
| 2001/0046154 A1 | 11/2001 | Forbes |
| 2002/0081822 A1 | 6/2002 | Yanageta |
| 2002/0136047 A1 | 9/2002 | Scheuerlein |
| 2003/0045064 A1 | 3/2003 | Kunikiyo |
| 2003/0049900 A1 | 3/2003 | Forbes |
| 2003/0102514 A1 * | 6/2003 | Sato ........................... 257/390 |
| 2003/0168684 A1 | 9/2003 | Pan |
| 2004/0084725 A1 | 5/2004 | Nishiwaki |
| 2004/0114413 A1 | 6/2004 | Parkinson |
| 2004/0114438 A1 | 6/2004 | Morimoto |
| 2004/0257878 A1 | 12/2004 | Morikawa |
| 2004/0262635 A1 | 12/2004 | Lee |
| 2005/0044703 A1 | 3/2005 | Liu |
| 2005/0092526 A1 | 5/2005 | Fielder |
| 2005/0122768 A1 | 6/2005 | Fukumoto |
| 2005/0145947 A1 | 7/2005 | Russ |
| 2005/0169043 A1 | 8/2005 | Yokoyama |
| 2005/0218521 A1 | 10/2005 | Lee |
| 2005/0253143 A1 | 11/2005 | Takaura |
| 2005/0280042 A1 | 12/2005 | Lee |
| 2005/0280061 A1 | 12/2005 | Lee |
| 2005/0280154 A1 | 12/2005 | Lee |
| 2005/0280155 A1 | 12/2005 | Lee |
| 2005/0280156 A1 | 12/2005 | Lee |
| 2005/0282356 A1 | 12/2005 | Lee |
| 2006/0073652 A1 | 4/2006 | Pellizzer |
| 2006/0076548 A1 | 4/2006 | Park |
| 2006/0091490 A1 * | 5/2006 | Chen et al. .................... 257/458 |
| 2006/0105517 A1 | 5/2006 | Johansson |
| 2006/0131554 A1 | 6/2006 | Joung |
| 2006/0275962 A1 | 12/2006 | Lee |
| 2007/0007536 A1 | 1/2007 | Hidaka |
| 2007/0077694 A1 | 4/2007 | Lee |
| 2007/0105241 A1 | 5/2007 | Leuschner |
| 2007/0113884 A1 | 5/2007 | Kensey |
| 2007/0115749 A1 | 5/2007 | Gilbert |
| 2007/0253245 A1 | 11/2007 | Ranjan |
| 2007/0279968 A1 | 12/2007 | Luo |
| 2007/0281439 A1 | 12/2007 | Bedell |
| 2007/0297223 A1 | 12/2007 | Chen |
| 2008/0007993 A1 | 1/2008 | Saitoh |
| 2008/0025083 A1 | 1/2008 | Okhonin |
| 2008/0029782 A1 | 2/2008 | Carpenter |
| 2008/0032463 A1 | 2/2008 | Lee |
| 2008/0037314 A1 | 2/2008 | Ueda |
| 2008/0038902 A1 | 2/2008 | Lee |
| 2008/0048327 A1 | 2/2008 | Lee |
| 2008/0064153 A1 * | 3/2008 | Qiang Lo et al. ............. 438/174 |
| 2008/0094873 A1 | 4/2008 | Lai |
| 2008/0108212 A1 | 5/2008 | Moss |
| 2008/0144355 A1 | 6/2008 | Boeve |
| 2008/0170432 A1 | 7/2008 | Asao |
| 2008/0191312 A1 | 8/2008 | Oh |
| 2008/0261380 A1 | 10/2008 | Lee |
| 2008/0265360 A1 | 10/2008 | Lee |
| 2008/0273380 A1 | 11/2008 | Diao |
| 2008/0310213 A1 | 12/2008 | Chen |
| 2008/0310219 A1 | 12/2008 | Chen |
| 2009/0014719 A1 | 1/2009 | Shimizu |
| 2009/0040855 A1 | 2/2009 | Luo |
| 2009/0052225 A1 | 2/2009 | Morimoto |
| 2009/0072246 A1 | 3/2009 | Genrikh |
| 2009/0072279 A1 | 3/2009 | Moselund |
| 2009/0146185 A1 * | 6/2009 | Suh et al. ........................ 257/194 |
| 2009/0161408 A1 | 6/2009 | Tanigami |
| 2009/0162979 A1 | 6/2009 | Yang |
| 2009/0185410 A1 | 7/2009 | Huai |
| 2009/0296449 A1 | 12/2009 | Slesazeck |
| 2010/0007344 A1 | 1/2010 | Guo |

(56) References Cited

U.S. PATENT DOCUMENTS

| | | |
|---|---|---|
| 2010/0066435 A1 | 3/2010 | Siprak |
| 2010/0067281 A1 | 3/2010 | Xi |
| 2010/0078758 A1 | 4/2010 | Sekar |
| 2010/0110756 A1 | 5/2010 | Khoury |
| 2010/0142256 A1 | 6/2010 | Kumar |
| 2010/0149856 A1 | 6/2010 | Tang |
| 2011/0079844 A1* | 4/2011 | Hsieh .......................... 257/334 |

FOREIGN PATENT DOCUMENTS

| | | |
|---|---|---|
| WO | WO 0062346 | 10/2000 |
| WO | WO 0215277 | 2/2002 |
| WO | WO 2005/124787 | 12/2005 |
| WO | WO 2006/100657 | 9/2006 |
| WO | WO 2007/100626 | 9/2007 |
| WO | WO 2007/128738 | 11/2007 |

OTHER PUBLICATIONS

Berger et al., Merged-Transitor Logic (MTL)—A Low-Cost Bipolar Logic Concept, Solid-State Circuits, IEEE Journal, vol. 7, Issue 5, pp. 340-346 (2003).

Chung et al., A New SOI Inverter for Low Power Applications, Proceedings 1996 IEEE International SOI Conference, Oct. 1996.

Hosomi et al., A Novel Nonvolatile Memory with Spin Torque Transfer Magnetization Switching: Spin-RAM, 2005 IEEE.

Hwang et al., Degradation of MOSFET's Drive Current Due to Halo Ion Implantation, Electron Devices Meeting, 1996, International Date: Dec. 8-11, 1996, pp. 567-570.

Internet website www.en.wikipedia.org/wiki/High-k dated Nov. 12, 2008.

Likharev, K., "Layered tunnel barrier for nonvolatile memory devices", Applied Physics Letters vol. 73, No. 15; Oct. 12, 1998.

Londergran et al., Interlayer Mediated Epitaxy of Cobalt Silicide on Silicon (100) from Low Temperature Chemical Vapor Deposition of Cobalt, Journal of the Electrochemical Society, 148 (1) C21-C27 (2001) C21.

Sayan, S., "Valence and conduction band offsets of a ZrO2/SiOxNy/ n-Si CMOS gate stack: A combined photoemission and inverse photoemission study", Phys. Stat. Sol. (b) 241, No. 10, pp. 2246-2252 (2004).

Takato et al., High Performance CMOS Surrounding Gate Transistor (SGT) for Ultra High Density LSIs, Downloaded on Apr. 14, 2009 from IEEE Xplore, pp. 222-225.

U.S. Appl. No. 12/175,545, filed Jul. 18, 2008, Inventors: Lou et al.
U.S. Appl. No. 12/120,715, filed May 15, 2008, Inventors: Tian et al.
U.S. Appl. No. 12/498,661, filed Jul. 7, 2009, Inventor: Khoury.
U.S. Appl. No. 12/502,211, filed Jul. 13, 2009, Inventor: Lu.

Wang et al., Precision Control of Halo Implanation for Scaling-down ULSI Manufacturing, IEEE International Symposium on Sep. 13-15, 2005, pp. 204-207.

Giacomini, R., et al., Modeling Silicon on Insulator MOS Transistors with Nonrectangular-Gate Layouts, Journal of the Electrochemical Society, 2006, pp. G218-G222, vol. 153, No. 3.

PCT/ISA/210 Int'l. Search Report and PCT/ISA/237 Written Opinion for PCT/US2010/041134 from the EPO.

Romanyuk, A., et al., Temperature-induced metal-semiconductor transition in W-doped VO2 films studied by photoelectron spectroscopy, Solar Energy Materials and Solar Cells, 2007, pp. 1831-1835, No. 91, Elsevier, Switzerland.

Zahler, James, et al., Wafer Bonding and Layer Transfer Processes for High Efficiency Solar Cells, NCPV and Solar Program Review Meeting, pp. 723-726, 2003.

* cited by examiner

TUNNELING TRANSISTORS

BACKGROUND

Non-volatile memory technologies are constantly advancing and have reached a point where three dimensional (3D) arrays may be the best option for achieving the desired high density. A switching device with a large forward to backward current ratio could more easily enable the 3D stacking of memory cells. Most standard semiconductor switches don't provide the necessary ratio and may require high temperature processes that are incompatible with memory device fabrication. Therefore, there remains a need for new switching devices.

BRIEF SUMMARY

One particular embodiment of this disclosure is a transistor that includes a source; a drain; a gate region, the gate region including: a gate; an island; and a gate oxide, wherein the gate oxide is positioned between the gate and the island; and the gate and island are coactively coupled to each other; and a source barrier and a drain barrier, wherein the source barrier separates the source from the gate region and the drain barrier separates the drain from the gate region.

Another particular embodiment of this disclosure is a memory array that includes a first memory array layer that includes a plurality of memory units, each memory unit having a transistor electrically coupled to a memory cell; and a second memory array layer that includes a plurality of memory units, each memory unit having a transistor electrically coupled to a memory cell, wherein the transistors include: a source; a drain; a gate region, the gate region including a gate; an island; and a gate oxide, wherein the gate oxide is positioned between the gate and the island; and the gate and island are coactively coupled to each other; and a source barrier and a drain barrier, wherein the source barrier separates the source from the gate region and the drain barrier separates the drain from the gate region.

Yet another particular embodiment of this disclosure is a transistor that includes a source; a drain; a gate region, the gate region including a gate; an island; and a gate oxide, wherein the gate oxide is positioned between the gate and the island; and the gate and island are coactively coupled to each other; and a source barrier and a drain barrier, wherein the source barrier separates the source from the gate region and the drain barrier separates the drain from the gate region, and wherein the source barrier and drain barrier are thinner proximate the island than they are proximate the gate.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

The present disclosure is directed to various embodiments of switching devices, or more specifically, transistors.

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. Any definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

While the present disclosure is not so limited, an appreciation of various aspects of the disclosure will be gained through a discussion of the examples provided below.

Figure 1A:
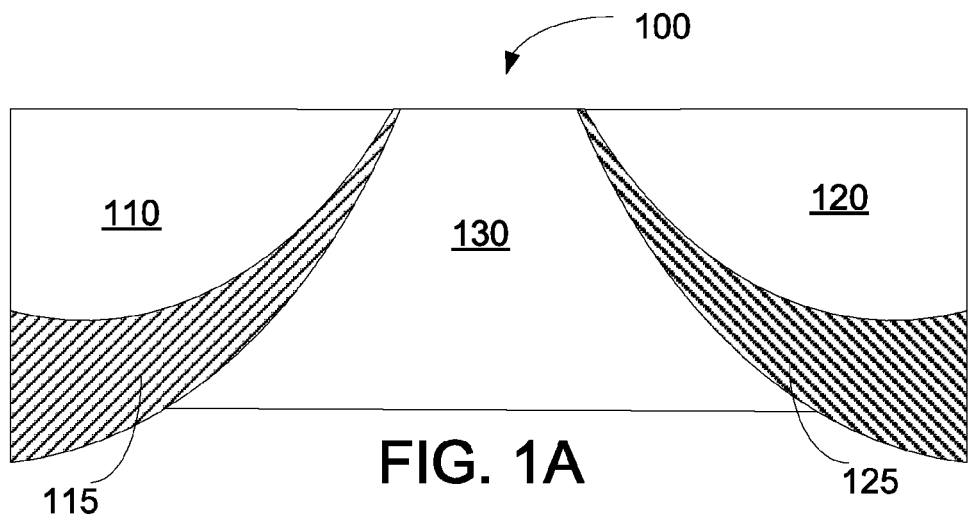
FIG. 1 is a schematic diagram of an exemplary embodiment of a disclosed transistor

FIG. 1A depicts an exemplary transistor 100 that includes a source 110, a drain 120, a gate region 130, a source barrier 115 and a drain barrier 125. Although not depicted herein, the transistor 100 can be formed on or within a substrate. Generally, the gate region 130 can be positioned between the source 110 and the drain 120. Disclosed transistors also include a source barrier 115 and a drain barrier 125. The source barrier 115 separates the source from the gate region 130 and the drain barrier 125 separates the drain from the gate region 130. The source barrier 115 and the drain barrier 125 can physically separate the source 110 and drain 120 respectively from the gate region 130, electrically separate the source 110 and drain 120 respectively from the gate region 130, or both physically and electrically separate the source 110 and drain 120 respectively from the gate region 130.

Figure 1B:
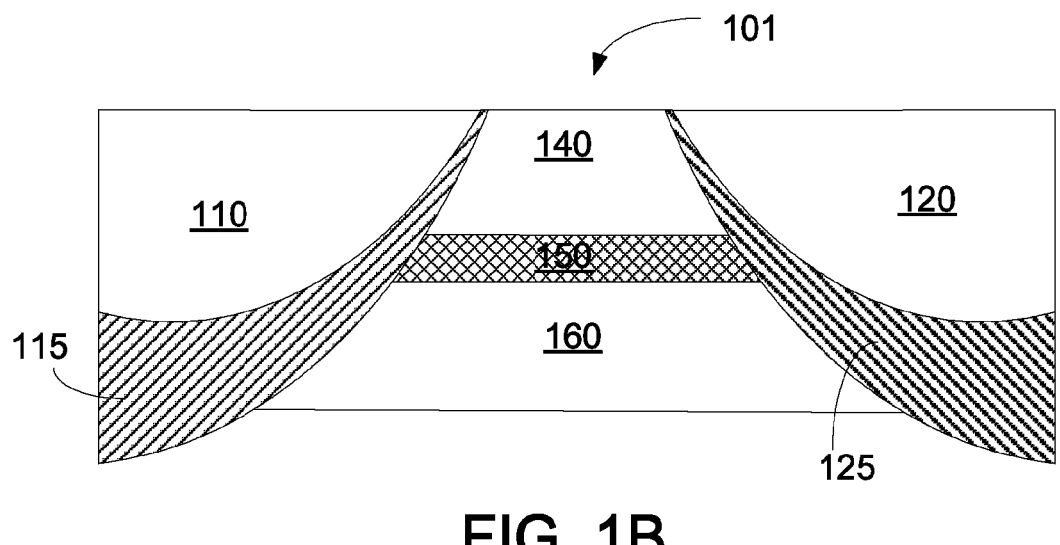

FIG. 1B depicts another exemplary transistor 100 that more specifically shows the gate region 130. The gate region 130 can more specifically include an island 140, a gate oxide 150 and a gate 160. Generally, the gate oxide 150 can be positioned between the island 140 and the gate 160. The gate oxide 150 can physically separate the island 140 and the gate 160, can electrically separate the island 140 and the gate 160, or can both physically and electrically separate the island 140 and the gate 160. In embodiments, the gate 160, the gate oxide 150, and island 140 can be stacked in a direction perpendicular (or orthogonal) to the relative location of the source 110 and drain 120 with respect to the gate region 130.

The gate 160 and the island 140 are coactively coupled to each other. In embodiments, the gate 160 is coactively coupled to the island 140 through the gate oxide 150. Two structures being "coactively coupled" generally means that the two structures are connected in their behavior. In embodiments, two structures (such as the gate 160 and the island 140) can be electrically coactively coupled, meaning that the electrical behavior of the two structures is connected. For example, applying a positive charge to one of the structures could elicit a negative charge in the other structure. In embodiments, application of a charge (either positive or negative) to the gate 160 can cause the opposite charge (either negative or positive) to build up in regions of the island 140 that are most proximate the gate 160. In embodiments, an applied bias on the gate can generate accumulation of the charge carriers (electrons or holes) in the region close to the gate oxide. The accumulation of the charge carriers depletes the charge carriers in the region of the island on the opposite end. Thus, the band structure of this depleted region can change, resulting in an increase of the energy barrier.

The source 110 and drain 120 can generally be made of either n- or p-type doped silicon (Si). The source 110 and drain 120 are generally either both n- or both p-type doped silicon. The gate 160 can generally be made of metals, metal oxides or poly-silicon. Exemplary metals that can be used for the gate 160 can include those having an appropriate band gap, such as tantalum, tungsten, tantalum nitride, and titanium nitride. Exemplary metal oxides that can be used for the gate 160 can include ruthenium oxide, $SrRuO_3$, $CaRuO_3$, and $(Sr,Ca)RuO_3$. In embodiments where poly-silicon is used for the gate 160, the poly-silicon can be highly doped poly-silicon. The gate oxide 150 can generally be made of silicon dioxide ($SiO_2$), or materials having a high dielectric constant (k) (compared to $SiO_2$). Exemplary high k materials can include zirconium dioxide ($ZrO_2$), yttrium oxide ($Y_2O_3$), hafnium dioxide ($HfO_2$), and silicon oxynitrides ($SiO_xN_y$). Solid solutions of high k materials (such as those listed above) can also be utilized for the gate oxide. The source barrier 115 and the drain barrier 125 can generally be made of $SiO_2$, or materials having a high dielectric constant (k) (compared to $SiO_2$). Exemplary high k materials can include $ZrO_2$, $Y_2O_3$, $HfO_2$, and $SiO_xN_y$. Solid solutions of high k materials (such as those listed above) can also be utilized for the source barrier 115 and drain barrier 125. The island 140 can generally be made of appropriately doped silicon with a particular level of carrier concentration, in embodiments, the silicon can be doped to a degenerate level. The island 140 can generally be made of an n- or p-type doped Si or a semiconductor oxide. Exemplary semiconductor oxides can include tin oxide (SnO), non-stoichiometric tin oxide ($Sn_2O_3$), and indium oxide ($In_2O_3$). Solid solutions of semiconductor oxides (such as those listed above) can also be utilized for the island 140.

In embodiments, the gate 160 can be made of degenerate poly-silicon. In embodiments, the gate oxide 150 can be made of $SiO_2$. In embodiments, the source barrier 115 and the drain barrier 125 can be made of $SiO_2$. In embodiments, the island 140 can be made of doped Si. In embodiments, the gate 160 can be made of degenerate poly-silicon; the gate oxide 150 can be made of $SiO_2$; the source barrier 115 and the drain barrier 125 can be made of $SiO_2$; and the island 140 can be made of doped Si.

Figure 2A:
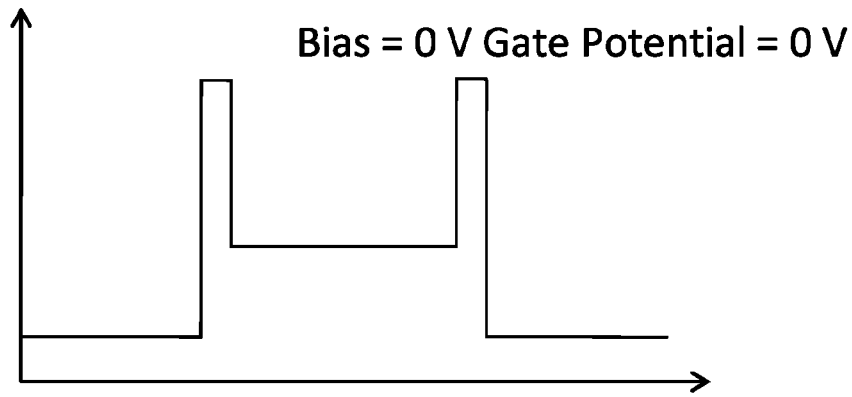
FIGS. 2A and 2B are schematic diagrams of the electrical band alignment with no bias and not gate potential applied (FIG. 2A); with a bias and no gate potential applied (FIG. 2B); and a bias and no gate potential applied (FIG. 2C)
Figure 2B:
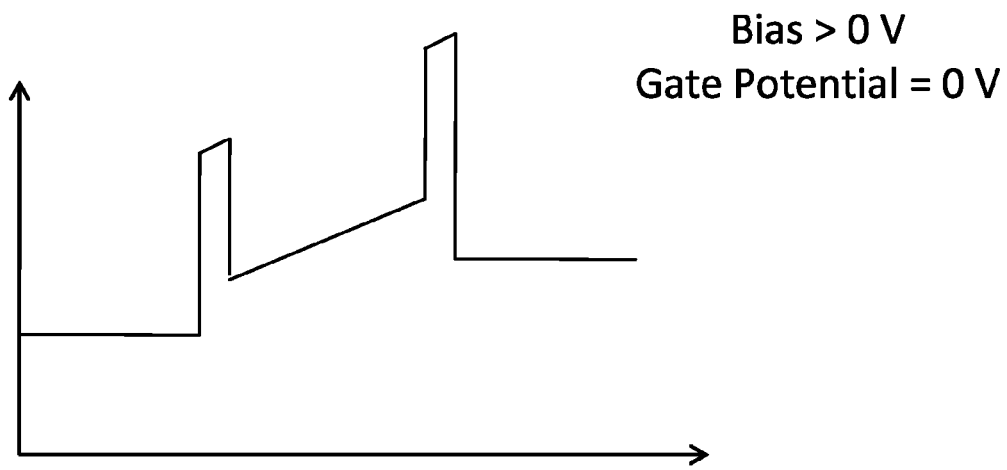

Transistors disclosed herein utilize the metal-oxide-semiconductor field effect (MOSFET). FIG. 2A shows an energy band diagram of an exemplary transistor when the bias is 0V and the gate potential is 0V. Without any potential (or a potential below the threshold voltage) applied to the gate, there is little or no conduction between the source and drain in either direction because the electrical barrier is high (as indicated by the height of the potential energy), even though the energy barrier of the island (the region in the middle) is low. FIG. 2B shows an energy band diagram of the exemplary transistor when the bias is greater than 0 V, and the gate potential is 0 V (or below the threshold voltage). As seen here, the electrical barrier of the drain barrier still contributes to stopping the tunneling current, even though from the drain to the source, it is electrically down hill.

Figure 2C:
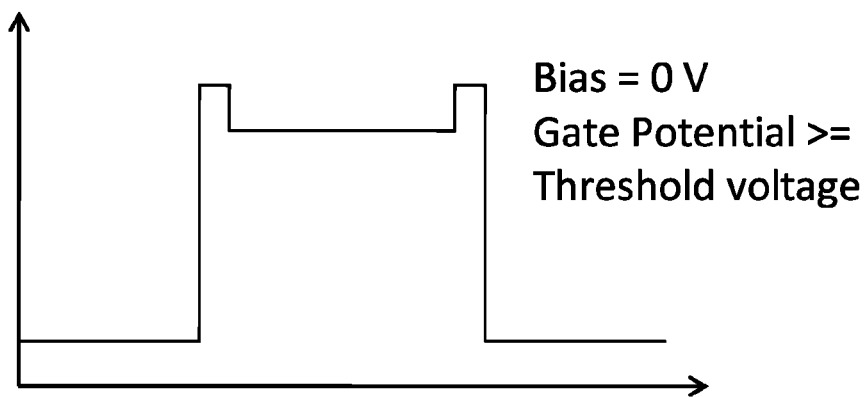

FIG. 2C shows an energy band diagram of the exemplary transistor when the bias voltage is 0 V, and the gate potential is at or above the threshold voltage. Application of a positive gate potential will, because of the coactively coupled gate and island, cause the electrons in the island to be drawn towards the gate oxide. This will in turn decrease the barrier to electrons tunneling from the source to the drain. This is shown in FIG. 2C by the increased energy level for the island. The large difference in barrier physical thickness when the gate potential is above and below the threshold voltage creates a large ratio between the forward and backward current.

In embodiments the source barrier and drain barrier can have variable thicknesses. In embodiments, the source barrier and drain barrier can be thinner proximate the island than they are proximate the gate. As seen in FIG. 1B, the source barrier 115 (for example) is thinner where it separates the source 110 from the island 140 than it is where it separates the source 110 from the gate 160. In embodiments, the source barrier 115 and the drain barrier 125 can have a thickness that can be a factor of two (2) times thinner proximate the island 140 than it is proximate the gate 160. Such a variable thickness can be created through ion milling, for example, of a precursor material making up the source barrier and drain barrier. Having the source barrier and drain barrier thinner proximate the island than the gate can create a thinner channel where the tunneling current exists. This can prevent significant leakage current through the region that is close to the gate oxide.

Figure 3:
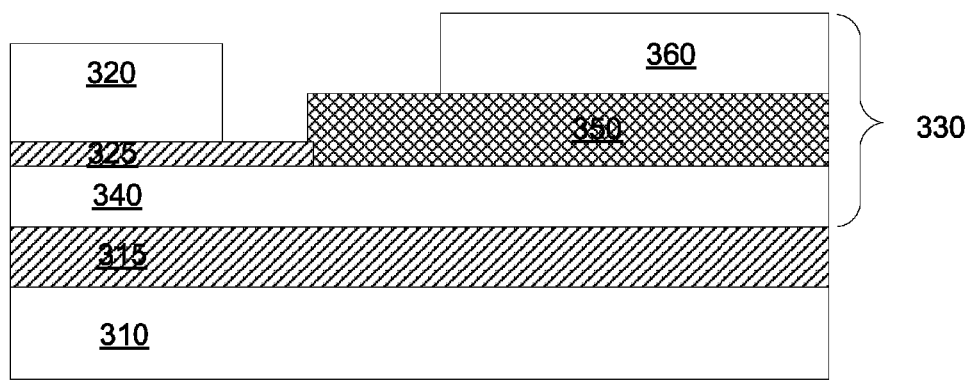
FIG. 3 is a schematic diagram of an exemplary embodiment of a disclosed transistor having a vertical configuration.

FIG. 3 depicts another exemplary embodiment of a disclosed transistor. This exemplary transistor 300 can generally include the same components as discussed above: a source 310, a drain 320, a gate region 330 that includes a gate 360 and an island 340 that are separated by a gate oxide 350, a source barrier 315 and a drain barrier 325. The materials and characteristics of the components can generally be the same as those discussed above. The source 310, source barrier 315, island 340, drain barrier 325 and drain 320 can be characterized as being stacked. In an embodiment, these components can be stacked in a vertical configuration on a substrate. The gate region 330 can be stacked on a portion of the previously noted stacked components so that the source barrier 315 and drain barrier 325 separate the source 310 and drain 320 respectively from the gate region 330. In an exemplary embodiment, at least the island 340 of the gate region 330 contacts the source barrier 315 and the drain barrier 325. In another exemplary embodiment, only the island 340 of the gate region 330 need contact the source barrier 315 and the drain barrier 325, and the gate oxide 350 and gate 360 can be displaced from the rest of the stack. In such an embodiment, the gate 360 can contact the gate oxide 350, but not the source barrier 315 or the drain barrier 325. In embodiments, the gate 360 can contact the gate oxide 350, but not any other components of the transistor 300 (except a substrate if present).

Such an exemplary transistor can yield a larger junction surface (than the embodiment depicted in FIGS. 1A and 1B) and current, which can lead to a large forward current density. In embodiments, such as that depicted in FIG. 3, the source barrier can, but need not be thicker than the drain barrier. Having the source barrier and the drain barrier with different thicknesses can serve to compensate for different junction areas that may be present (compare the area of drain barrier 325 to source barrier 315 in the exemplary embodiment depicted in FIG. 3).

Figure 4:
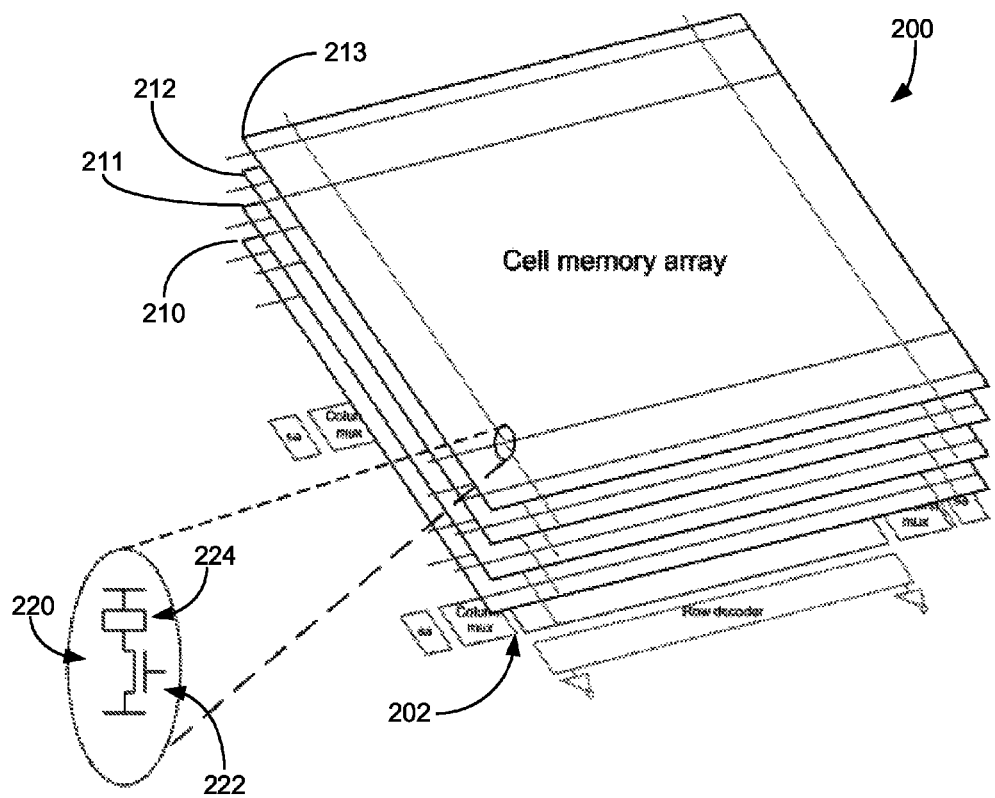
FIG. 4 is an exploded perspective schematic diagram of an illustrative 3D memory array.

FIG. 4 is an exploded perspective schematic diagram of an illustrative 3D memory array 200. The 3D memory array 200 can include a plurality of memory array layers 210, 211, 212, and 213 stacked sequentially to form the memory array 200. The 3D memory array 200 can also optionally include a base circuitry layer 202. Each memory array layer layers 210, 211, 212, and 213 can be electrically coupled to the base circuitry layer 202. Each memory array layer 210, 211, 212, and 213 can include a plurality of memory units 220 including a transistor 222, as discussed above, that is electrically coupled to a memory cell 224. Each memory unit 220 can be located at the intersection of row and column lines forming cross point architecture.

The memory cells 224 can be spin torque transfer random access memory (STRAM) or resistive random access memory (RRAM) cells. The plurality of memory array layers 210, 211, 212, and 213 can be stacked in a co-planar arrangement where each of the layers are electrically isolated form each other. Each of the plurality of memory array layers 210, 211, 212, and 213 are electrically coupled to the base circuitry layer 202 and can be operated by the base circuitry layer 202.

Thus, embodiments of TUNNELLING TRANSISTORS are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present disclosure is limited only by the claims that follow.

What is claimed is:

1. A transistor comprising:
   a source;
   a drain;
   a gate region, the gate region comprising:
      a gate;
      an island; and
      a gate oxide,
   wherein the gate oxide is positioned between the gate and the island; and the gate and island are electrically coactively coupled to each other; and
   a source barrier and a drain barrier,
   wherein the source barrier separates the source from the gate region and the drain barrier separates the drain from the gate region, and wherein the source barrier and drain barrier are thinner proximate the island than they are proximate the gate.

2. The transistor according to claim 1, wherein the source barrier and drain barrier have a variable thickness.

3. The transistor according to claim 1, wherein the source and drain comprise n- or p-type doped silicon.

4. The transistor according to claim 1, wherein the gate comprises a metal, a metal oxide or poly-silicon.

5. The transistor according to claim 1, wherein the gate oxide comprises $SiO_2$, or a material having a high dielectric constant.

6. The transistor according to claim 5, wherein the gate oxide comprises $ZrO_2$, $Y_2O_3$, $HfO_2$, $SiO_xN_y$, or solid solutions thereof.

7. The transistor according to claim 1, wherein the source barrier and drain barrier independently comprise $SiO_2$, or a material having a high dielectric constant.

8. The transistor according to claim 7, wherein the source barrier and drain barrier independently comprise $ZrO_2$, $Y_2O_3$, $HfO_2$, $SiO_xN_y$, or solid solutions thereof.

9. The transistor according to claim 1, wherein the island comprises n- or p-type doped silicon or a semiconductor oxide.

10. The transistor according to claim 9, wherein the island comprises $SnO$, $Sn_2O_3$, $In_2O_3$, or solid solutions thereof 11. The transistor according to claim 1, wherein the source, source barrier, island, drain barrier, and drain are stacked on a substrate.

12. The transistor according to claim 11, wherein the source barrier is thicker than the drain barrier.

13. The transistor according to claim 11, wherein at least the island of the gate region contacts both the source barrier and the drain barrier.

14. The transistor according to claim 13, wherein the gate contacts only the gate oxide.

15. A memory array comprising:
   a first memory array layer that comprises a plurality of memory units, each memory unit comprising a transistor electrically coupled to a memory cell; and
   a second memory array layer that comprises a plurality of memory units, each memory unit comprising a transistor electrically coupled to a memory cell,
   wherein the transistors comprise:
      a source;
      a drain;
      a gate region, the gate region comprising:
         a gate;
         an island; and
         a gate oxide, wherein the gate oxide is positioned between the gate and the island; and the gate and island are electrically coactively coupled to each other; and
      a source barrier and a drain barrier,
   wherein the source barrier separates the source from the gate region and the drain barrier separates the drain from the gate region; and
   wherein the source barrier and drain barrier are thinner proximate the island than they are proximate the gate.

16. The memory array according to claim 15, wherein the first memory array layer and the second memory array layer includes a plurality of rows and columns of memory units.

17. The memory array according to claim 15 further comprising three or more memory array layers stacked sequentially to form the memory array.

* * * * *